(12) United States Patent
Wada et al.

(10) Patent No.: US 8,389,428 B2
(45) Date of Patent: Mar. 5, 2013

(54) GLASS COMPOSITION AND MEMBER HAVING THE SAME ON SUBSTRATE

(75) Inventors: Naoya Wada, Tokyo (JP); Nobuhiro Nakamura, Tokyo (JP); Nao Ishibashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/137,165

(22) Filed: Jul. 25, 2011

(65) Prior Publication Data

US 2011/0287264 A1    Nov. 24, 2011

Related U.S. Application Data

(63) Continuation of application No. PCT/JP2010/050731, filed on Jan. 21, 2010.

(30) Foreign Application Priority Data

Jan. 26, 2009   (JP) ................................ P2009-014331

(51) Int. Cl.
    C03C 3/17      (2006.01)
    C03C 3/145     (2006.01)
    C03C 3/19      (2006.01)
    C03C 3/21      (2006.01)
    B32B 17/06     (2006.01)

(52) U.S. Cl. ............... 501/48; 501/24; 501/26; 501/46; 501/47; 501/52; 428/426; 428/428

(58) Field of Classification Search ................ 501/45, 501/46, 135
    See application file for complete search history.

(56) References Cited

U.S. PATENT DOCUMENTS

| | | | |
|---|---|---|---|
| 5,246,890 A * | 9/1993 | Aitken et al. | 501/15 |
| 6,333,282 B1 | 12/2001 | Nakahata et al. | |
| 7,638,448 B2 * | 12/2009 | Wolff et al. | 501/45 |
| 2004/0266602 A1 | 12/2004 | Fujiwara et al. | |
| 2005/0032621 A1 | 2/2005 | Zou et al. | |
| 2005/0159290 A1 | 7/2005 | Yamamoto et al. | |
| 2005/0188724 A1 | 9/2005 | Ikenishi et al. | |
| 2006/0128549 A1 * | 6/2006 | Hormadaly | 501/45 |
| 2007/0042891 A1 * | 2/2007 | Ritter et al. | 501/46 |
| 2007/0249483 A1 | 10/2007 | Ritter et al. | |
| 2008/0242528 A1 | 10/2008 | Saito | |

FOREIGN PATENT DOCUMENTS

| | | |
|---|---|---|
| EP | 2 178 343 A1 | 4/2010 |
| EP | 2 383 235 A1 | 11/2011 |
| JP | 2001-058845 | 3/2001 |
| JP | 2002-201039 | 7/2002 |
| JP | 2003-160355 | 6/2003 |
| JP | 2003-300751 | 10/2003 |
| JP | 2005-154248 | 6/2005 |
| JP | 2005-154253 | 6/2005 |
| JP | 2005-200261 | 7/2005 |
| JP | 2005-247659 | 9/2005 |
| JP | 2006-111499 | 4/2006 |
| JP | 2007-015904 | 1/2007 |
| JP | 2007-051060 | 3/2007 |
| JP | 2007-119343 | 5/2007 |
| JP | 2007-299997 | 11/2007 |
| JP | 2008-133148 | 6/2008 |
| JP | 2008-247710 | 10/2008 |
| JP | 2009-013026 | 1/2009 |
| JP | 2009-014331 (A) | 1/2009 |
| JP | 2009-014332 (A) | 1/2009 |
| WO | WO 2008-065937 | 6/2008 |

OTHER PUBLICATIONS

International Search Report dated Mar. 30, 2010, PCT/JP2010/050731.
Communication Pursuant to Rule 114(2)—Third Party Observation for Application No. EP 20100733532 dated Nov. 26, 2012.

* cited by examiner

Primary Examiner — David Sample
(74) Attorney, Agent, or Firm — Foley & Lardner LLP

(57) ABSTRACT

A glass composition having high refractive index, softening property at low temperature and small average thermal expansion coefficient, and a member provided with the composition on a substrate, are provided. The glass composition of the present invention has a refractive index ($n_d$) of from 1.88 to 2.20, a glass transition temperature ($T_g$) of from 450 to 490° C., and an average thermal expansion coefficient at temperatures from 50° C. to 300° C. ($\alpha_{50\text{-}300}$) of from $60\times10^{-7}$/K to $90\times10^{-7}$/K, and includes $Bi_2O_3$ in an amount of from 5 to 25% in terms of mol % on the basis of oxides.

10 Claims, 1 Drawing Sheet

GLASS COMPOSITION AND MEMBER HAVING THE SAME ON SUBSTRATE

TECHNICAL FIELD

The present invention relates to a glass composition having high refractive index, softening property at low temperature and small average thermal expansion coefficient, and a member provided with the composition on a substrate.

BACKGROUND ART

Conventionally, a glass composition having (1) high refractive index (refractive index at the d line is from 1.88 to 2.20), (2) low softening temperature (490° C. or lower) and (3) small average thermal expansion coefficient (the average thermal expansion coefficient is (65 to 90)×$10^{-7}$/K), and a member provided with the glass composition on a substrate (hereinafter referred to as "glass composition and the like) have not been present.

The glass composition and the like simultaneously provided with at most two requirements of the above three requirements are proposed (Patent Documents 1 to 5).

In recent years, environmental pollution becomes serious problem in the melting of a glass containing lead oxide. Therefore, the glass is required to not contain lead oxide.

BACKGROUND ART DOCUMENT

Patent Documents

Patent Document 1: JP-A-2003-300751
Patent Document 2: JP-A-2003-160355
Patent Document 3: JP-A-2006-111499
Patent Document 4: JP-A-2002-201039
Patent Document 5: JP-A-2007-51060

SUMMARY OF THE INVENTION

Problems that the Invention is to Solve

However, any of Patent Documents 1 to 5 does not disclose or suggest to be simultaneously provided with the above three requirements. It is necessary to be simultaneously provided with the three requirements in order to form a high refractive index film on a soda lime substrate by firing glass frit/glass paste. The glasses of Patent Documents 1 to 3 are developed for use in precision press molding lens. For this reason, the glasses of Patent Documents 1 to 3 do not have the object to fire as a fit, and therefore have the problem that an average thermal expansion coefficient is large.

The glass of Patent Document 4 contains a large amount of bismuth. For this reason, the glass of Patent Document 4 has the problems that coloration is large and an average thermal expansion coefficient is large.

The glass of Patent Document 5 is developed for use in precision press molding lens. For this reason, the glass of Patent Document 5 does not have the object to fire as a frit, and therefore has the problem that a glass transition temperature is high.

The present invention provides a glass composition having high refractive index, softening property at low temperature and small average thermal expansion coefficient, and a member provided with the glass composition on a substrate.

Means for Solving the Problems

A glass composition the present invention has a refractive index ($n_d$) of from 1.88 to 2.20, a glass transition temperature ($T_g$) of from 450 to 490° C., and an average thermal expansion coefficient at temperatures from 50° C. to 300° C. ($\alpha_{50\text{-}300}$) of from 60×$10^{-7}$/K to 90×$10^{-7}$/K, and comprises $Bi_2O_3$ in an amount of from 5 to 25% in terms of mol % on the basis of oxides.

A glass frit of the present invention has a refractive index ($n_d$) of from 1.88 to 2.20, a glass transition temperature ($T_g$) of from 450 to 490° C., and an average thermal expansion coefficient at temperatures from 50° C. to 300° C. ($\alpha_{50\text{-}300}$) of from 60×$10^{-7}$/K to 90×$10^{-7}$/K, and includes $Bi_2O_3$ in an amount of from 5 to 25% in terms of mol % on the basis of oxides.

A member of the present invention includes the glass composition or the glass frit having a refractive index ($n_d$) of from 1.88 to 2.20, a glass transition temperature ($T_g$) of from 450 to 490° C., and an average thermal expansion coefficient at temperatures from 50° C. to 300° C. ($\alpha_{50\text{-}300}$) of from 60×$10^{-7}$/K to 90×$10^{-7}$/K, and comprising $Bi_2O_3$ in an amount of from 5 to 25% in terms of mol % on the basis of oxides.

Advantage of the Invention

According to the present invention, a glass composition having high refractive index, softening property at low temperature and small average thermal expansion coefficient, and a member provided with the composition on a substrate can be provided.

MODE FOR CARRYING OUT THE INVENTION

Figure 1:
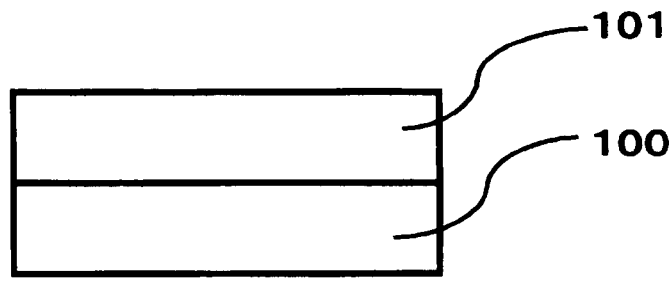
FIG. 1 is a view showing a member having a glass frit fired layer formed on a glass or ceramic substrate.

The refractive index ($n_d$) of the glass composition of the present invention is a range of from 1.88 to 2.20. When the refractive index is fallen in this range, the effect of extracting the emitted light is large in the case of using as an organic LED scattering layer.

The refractive index ($n_d$) of the glass composition of the present invention is preferably from 1.95 to 2.10.

The glass transition temperature ($T_g$) of the glass composition of the present invention is from 450 to 490° C. When the glass transition temperature is fallen in this range, a substrate does not deform by a temperature even though the glass frit of the present invention is fired and softened on a soda lime glass substrate. The glass transition temperature ($T_g$) is preferably from 450 to 480° C., and more preferably from 450 to 475° C. The glass transition temperature ($T_g$) used herein is defined by the temperature corresponding to viscosity coefficient η of glass=$10^{14}$ dPa·S.

The average thermal expansion coefficient of the glass composition of the present invention is from 60×$10^{-7}$/K to 90×$10^{-7}$/K in a temperature range of from 50 to 300° C. When the average thermal expansion coefficient is satisfied with this requirement, even though the glass frit of the present invention is fired and softened on the soda lime glass substrate, the glass frit does not break and the substrate does not greatly warp. The average thermal expansion coefficient at temperatures from 50 to 300° C. is preferably from 65×$10^{-7}$/K to 85×$10^{-7}$/K, and particularly preferably from 70×$10^{-7}$/K to 75×$10^{-7}$/K. The average thermal expansion coefficient is a numerical value measured with a thermo-mechanical analyzer (TMA).

The glass composition of the present invention contains $P_2O_5$, $Bi_2O_3$, $Nb_2O_5$ and ZnO as essential components, and can contain $B_2O_3$, $Li_2O$, $Na_2O$, $K_2O$, $TiO_2$, $WO_3$, $TeO_2$, $GeO_2$, $Sb_2O_3$ and alkaline earth metal oxides as optional components.

The range of each component content is, in terms of mol %, 15 to 30% of $P_2O_5$, 5 to 25% of $Bi_2O_3$, 5 to 27% of $Nb_2O_5$, 4 to 35% of ZnO, 0 to 17% of $B_2O_3$, 0 to 14% of $Li_2O$, 0 to 7% of $Na_2O$, 0 to 7% of $K_2O$, 0 to 13% of $TiO_2$, 0 to 20% of $WO_3$, 0 to 7% of $TeO_2$, 0 to 7% of $GeO_2$, 0 to 2% of $Sb_2O_3$ and 0 to 10% of alkaline earth metal oxides, in which the total content of alkali metal oxides is 14% or less.

In the components of the glass composition of the present invention, $P_2O_5$ is an essential component which forms a network structure becoming a skeleton of a glass, and imparts stability to a glass. In the case where $P_2O_5$ is less than 15 mol %, the glass is easily devitrified. In the case where $P_2O_5$ exceeds 30 mol %, it becomes difficult to obtain high refractive index required in the present invention. The preferred range thereof is 19 to 28 mol %, and further preferred range is 20 to 26 mol %.

$Bi_2O_3$ is an essential component which imparts high refractive index and increases stability of a glass, and in the case where the content thereof is less than 5%, its effect becomes insufficient. At the same time, $Bi_2O_3$ increases the average thermal expansion coefficient and additionally increases coloration. Therefore, the content is 25 mol % or less. The preferred range thereof is 10 to 23 mol %, and further preferred range of 13 to 20 mol %.

$Nb_2O_5$ is an essential component which imparts high refractive index and additionally lowers the average thermal expansion coefficient, and in the case where the content is less than 5 mol %, its effect becomes insufficient. At the same time, $Nb_2O_5$ increases the glass transition temperature. Therefore, the content is 27 mol % or less. In the case where $Nb_2O_5$ exceeds 27 mol %, the glass transition temperature becomes too high, and the glass is easily devitrified. The preferred range thereof is 7 to 20 mol %, and further preferred range is 10 to 18 mol %.

ZnO is an essential component which greatly decreases the glass transition temperature while suppressing excess increase in the average thermal expansion coefficient, and additionally has the effect to impart high refractive index. In the case where the content is less than 4 mol %, its effect becomes insufficient. On the other hand, in the case where ZnO exceeds 35 mol %, devitrification tendency of a glass is increased. The content of ZnO is 4 to 35 mol %, preferably 16 to 35 mol % (7 to 17% in mass % indication), more preferably 21 to 35 mol % (9 to 17% in mass % indication), and particularly preferably more than 23 mol % and more than 10 mass %, and up to 35 mol %. However, in the case of containing ZnO in an amount of 21 mol % or more, it is preferred that $TiO_2$ is not substantially contained in order to avoid devitrification.

$B_2O_3$ is not an essential component, but has the effect of improving meltability of a glass. In the case where the content exceeds 17 mol %, devitrification and phase separation easily occur, and additionally it becomes difficult to obtain high refractive index required in the present invention.

$Li_2O$ has the effect of imparting devitrification resistance to a glass and additionally decreasing the glass transition temperature, but at the same time, increases the average thermal expansion coefficient. In the case where $Li_2O$ is excessively contained, the average thermal expansion coefficient becomes too large. Therefore, the content of $Li_2O$ is preferably 0 to 14 mol %, and more preferably 2 to 7 mol %.

$Na_2O$ has the effect of imparting devitrification resistance of a glass, but depending of its content, the average thermal expansion coefficient is extremely increased. $Na_2O$ can be contained in a range of 0 to 7 mol % (0 to 2.5% in mass % indication), but it is more preferred that $Na_2O$ is not substantially contained.

$K_2O$ has the effect of imparting devitrification resistance to a glass, but depending of its content, the average thermal expansion coefficient is extremely increased. $K_2O$ can be contained in a range of 0 to 7 mol %, but it is more preferred that $K_2O$ is not substantially contained.

$TiO_2$ has the effect of imparting high refractive index, but depending on its content, the glass transition temperature is increased and additionally, a glass is easily devitrified. $TiO_2$ can be contained in a range of 0 to 13 mol %. It is preferred that the content is 0 to 9 mol %, and it is more preferred that $TiO_2$ is not substantially contained.

$WO_3$ has the effect of imparting high refractive index without greatly changing the average thermal expansion coefficient and the glass transition temperature. However, when the content exceeds 20 mol %, coloration is increased, and additionally, a glass is easily devitrified.

$TeO_2$ has the effect of decreasing the glass transition temperature while suppressing excess increase in the average thermal expansion coefficient. However, $TeO_2$ is expensive and may corrode a platinum crucible. Therefore, the content thereof is 7 mol % or less.

$GeO_2$ has the effect of imparting high refractive index, but is expensive. Therefore, it is not preferred that the content exceeds 7 mol %.

$Sb_2O_3$ is effective as a refining agent, and further has the effect of suppressing coloration. $Sb_2O_3$ can be added in a range of 0 to 2 mol %.

The alkaline earth metal oxides (at least one kind of MgO, CaO, SrO and BaO) improve the stability of a glass. However, in the case where those are contained exceeding 10 mol %, the refractive index is decreased, and additionally the average thermal expansion coefficient and the glass transition temperature are increased.

The alkaline metal oxides have the effects of imparting devitrification resistance to a glass and decreasing the glass transition temperature. Therefore, the total content thereof is preferably 14 mol % or less, and more preferably 2 to 7 mol %.

$Na_2O$ and $K_2O$ particularly increase the thermal expansion coefficient, as compared with $Li_2O$. Therefore, it is preferred that $Na_2O$ and $K_2O$ are not substantially contained and only $Li_2O$ is used.

The glass composition of the present invention can contain $SiO_2$, $Al_2O_3$, $La_2O_3$, $Y_2O_3$, $Gd_2O_3$, $ZrO_2$, $Ta_2O_3$, $Cs_2O$, transition metal oxides and the like in a range that the effect of the invention is not impaired. The total content thereof is preferably less than 5%, and more preferably less than 3 mol %, and it is further preferred that those are not substantially contained (the content is substantially zero).

The glass of the present invention does not substantially contain lead oxide (the content is substantially zero). Therefore, the possibility of causing environmental pollution is low.

The term "does not substantially contain" used herein means that the components are not positively contained, and includes the case that the components are incorporated as impurities derived from other components.

The glass composition of the present invention can be obtained by using raw materials such as oxides, phosphates, metaphosphates, carbonates, nitrates and hydroxides, weighing those so as to achieve a desired composition, mixing those, melting the mixture at a temperature of 950 to 1,500° C. using a crucible of platinum or the like, casting the melt or pouring the melt in a space of a twin-roll, and rapidly cooling the melt. The melt may be slowly cooled to remove strain.

The glass frit of the present invention is obtained by grinding the glass composition obtained by the above method with a mortar, a ball mill, a jet mill or the like, and as necessary, classifying the resulting powder. The mass-standard average particle size of the glass frit is typically 0.5 to 10 μm. The surface of the frit glass may be modified with a surfactant or a silane coupling agent. The mass-standard average particle size is a particle diameter measured with a laser diffraction type particle size distribution measurement method.

The member of the present invention is a member having a glass layer having a given composition formed on a glass or ceramic substrate, as shown in FIG. 1. The thickness of the glass layer is typically 5 to 50 μm. The substrate used is preferably that the average thermal expansion coefficient at temperatures from 50 to 300° C. ($\alpha_{50\text{-}300}$) is from $75\times10^{-7}$/K to $90\times10^{-7}$/K, and examples of the substrate include a soda lime glass and PD200, a product of Asahi Glass Co., Ltd. The surface of the substrate may be coated with a silica film or the like. The member is typically obtained by kneading the glass frit with a solvent, a binder or the like as necessary, applying the mixture to the substrate, firing the coating at a temperature about 60° C. or more higher than the glass transition temperature of the glass frit to soften the glass frit, and cooling the glass frit to a room temperature. Examples of the solvent includes α-terpineol, butyl carbitol acetate, phthalic acid ester and 2,2,4-trimethyl-1,3-pentanediol monoisobutyrate, and examples of the binder include ethyl cellulose, acrylic resin, styrene resin, phenol resin and butyral resin. Components other than the solvent and the binder may be contained in a range that the object of the present invention is not impaired. In the case of using the binder, it is preferred to include a step of firing the glass frit at a temperature lower than the glass transition temperature to vaporize the binder before softening the glass frit, before softening the glass frit.

Figure 2:
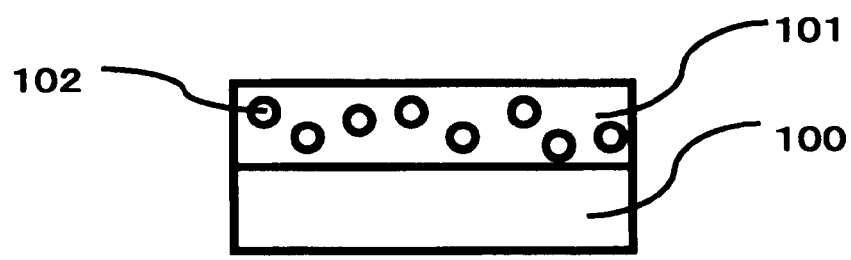
FIG. 2 is a view showing a member containing scattering materials in the glass frit fired layer.

The member of the present invention can contain scattering materials in the glass fit fired layer as shown in FIG. 2. However, it is important that the distribution of the scattering materials in the scattering layer decreases from the inside of the fired layer toward the surface thereof. By this distribution, the probability that the scattering materials are present in the surface layer of the glass frit fired layer is lower than the inside of the scattering layer, and as a result, a flat and smooth surface can be obtained. For this reason, in the case of forming, for example, an organic LED element, a translucent electrode layer and an organic layer can be formed uniformly, and interelectrode distance between reflective electrodes formed on the organic layer becomes uniform. As a result, long life of an element can be attempted. There are the cases that the scattering materials are gas bubbles, are particles of a material having a composition different from the glass fit, and are crystals precipitated from the glass frit. Those may be a simple body or a mixed state.

Figure 3:
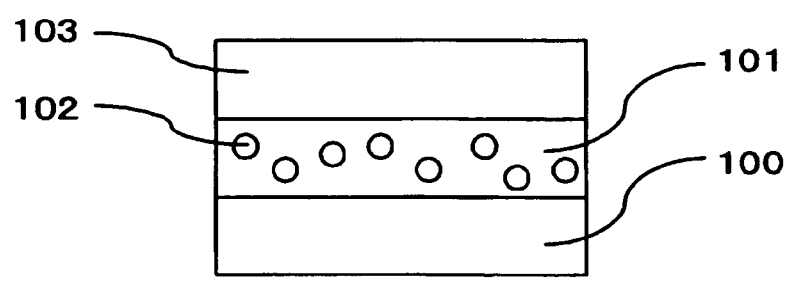
FIG. 3 is a view showing a member having a translucent electrode layer film-formed on the glass frit fired layer.

In the member of the present invention, as shown in FIG. 3, the translucent electrode layer can be formed on the glass fit fired layer by a film forming method such as sputtering. In the case of using as an organic LED scattering layer, the refractive index of the translucent electrode layer is preferably lower than the refractive index of the glass frit. By satisfying this requirement, the emitted light from the organic layer can be extracted with good efficiency. The translucent electrode layer is typically ITO (Indium Tin Oxide), and can further use $SnO_2$, ZnO, IZO (Indium Zinc Oxide) and the like.

EXAMPLES

Examples 1 to 27

Composition of the glass in terms of mol %, refractive index ($n_d$), glass transition temperature ($T_g$), and average thermal expansion coefficient ($\alpha_{50\text{-}300}$) at temperatures from 50° C. to 300° C., in each Example are shown in Tables 1 to 3. Composition in terms of mass % calculated based on the composition in terms of mol % is also shown therein. In each glass composition, when the glass transition temperature was 490° C. or lower and the average thermal expansion coefficient was from $60\times10^{-7}$/K to $85\times10^{-7}$/K, the glass composition was evaluated as "Good". Particularly, when the glass transition temperature was 475° C. or lower and the average thermal expansion coefficient was from $70\times10^{-7}$/K to $75\times10^{-7}$/K, the glass composition was evaluated as "Excellent". Each glass composition was obtained as follows. Oxides, phosphates, metaphosphates and carbonates were used as raw materials of each component. The raw materials were weighted so as to achieve the composition shown in Table 1 after vitrification, and sufficiently mixed. The mixture was melted in an electric furnace at a temperature range of 950 to 1,350° C. using a platinum crucible. The melt was cast in a carbon-made mold, and the resulting glass cast was cooled to the transition temperature, immediately placed in an annealing furnace, and slowly cooled to a room temperature.

The refractive index ($n_d$), the glass transition temperature ($T_g$), and the average thermal expansion coefficient ($\alpha_{50\text{-}300}$) at temperatures from 50° C. to 300° C., of the glass compositions obtained were measured as follows.

(1) Refractive Index ($n_d$)

After polishing a glass, its refractive index was measured with a precision refractometer KPR-2000, a product of Kalnew, by a V block method.

(2) Grass Transition Temperature ($T_g$)

A glass was processed into a rod having a diameter of 5 mm and a length of 200 mm, and its glass transition temperature was measured with a thermomechanical analyzer (TMA) TD5000SA, a product of Bruker AXS in a temperature rising rate of 5° C./min.

(3) Average Thermal Expansion Coefficient ($\alpha_{50\text{-}300}$) at Temperatures from 50° C. to 300° C.

A glass was processed into a rod having a diameter of 5 mm and a length of 200 mm, and its average thermal expansion coefficient was measured with a thermomechanical analyzer (TMA) TD5000SA, a product of Bruker AXS in a temperature rising rate of 5° C./min. When the length of the glass rod at 50° C. is $L_{50}$ and the length of the glass rod at 300° C. is $L_{300}$, the average thermal expansion coefficient ($\alpha_{50\text{-}300}$) at temperatures from 50° C. to 300° C. is obtained by $\alpha_{50\text{-}300} = \{(L_{300}/L_{50})-1\}/(300-50)$.

TABLE 1

| Example | 1 | 2 | 3 | 4 | 5 | 6 | 7 | 8 | 9 |
|---|---|---|---|---|---|---|---|---|---|
| | Mol % | Mol % | Mol % | Mol % | Mol % | Mol % | Mol % | Mol % | Mol % |
| $P_2O_5$ | 21.9 | 20.5 | 20.0 | 19.7 | 21.7 | 22.1 | 19.7 | 15.9 | 25.1 |
| $Bi_2O_3$ | 15.7 | 14.7 | 17.3 | 14.2 | 15.6 | 13.9 | 12.9 | 20.9 | 16.4 |
| $Nb_2O_5$ | 16.7 | 19.0 | 13.9 | 15.0 | 16.5 | 14.8 | 13.7 | 12.0 | 17.3 |
| ZnO | 4.7 | 8.0 | 18.1 | 19.7 | 21.6 | 24.3 | 31.1 | 20.4 | 22.7 |
| $B_2O_3$ | 11.4 | 10.6 | 10.4 | 10.3 | 11.2 | 11.5 | 10.2 | 8.9 | 13.0 |
| $Li_2O$ | 11.5 | 10.3 | 5.2 | 4.8 | 3.7 | 4.7 | 4.3 | 5.0 | 5.5 |
| $Na_2O$ | 0.0 | 0.0 | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 | 0.0 | 0.0 |

TABLE 1-continued

| Example | 1 | 2 | 3 | 4 | 5 | 6 | 7 | 8 | 9 |
|---|---|---|---|---|---|---|---|---|---|
| $TiO_2$ | 8.7 | 7.7 | 6.9 | 7.4 | 0.0 | 0.0 | 0.0 | 7.7 | 0.0 |
| $WO_3$ | 9.9 | 9.2 | 8.2 | 8.9 | 9.7 | 8.7 | 8.1 | 9.2 | 0.0 |
| Other component | — | — | — | — | — | — | — | — | — |
| Total | 100.0 | 100.0 | 100.0 | 100.0 | 100.0 | 100.0 | 100.0 | 100.0 | 100.0 |
|  | Mass % | Mass % | Mass % | Mass % | Mass % | Mass % | Mass % | Mass % | Mass % |
| $P_2O_5$ | 16.1 | 15.1 | 14.6 | 15.1 | 15.7 | 17.0 | 15.8 | 11.1 | 19.0 |
| $Bi_2O_3$ | 37.8 | 35.6 | 41.6 | 35.7 | 37.0 | 35.0 | 34.0 | 47.8 | 40.8 |
| $Nb_2O_5$ | 22.9 | 26.2 | 19.1 | 21.5 | 22.3 | 21.3 | 20.6 | 15.7 | 24.6 |
| ZnO | 2.0 | 3.4 | 7.6 | 8.7 | 9.0 | 10.7 | 14.3 | 8.2 | 9.9 |
| $B_2O_3$ | 4.1 | 3.8 | 3.7 | 3.9 | 4.0 | 4.3 | 4.0 | 3.0 | 4.8 |
| $Li_2O$ | 1.8 | 1.6 | 0.8 | 0.8 | 0.6 | 0.8 | 0.7 | 0.7 | 0.9 |
| $Na_2O$ | 0.0 | 0.0 | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 | 0.0 | 0.0 |
| $TiO_2$ | 3.4 | 3.2 | 2.8 | 3.2 | 0.0 | 0.0 | 0.0 | 3.0 | 0.0 |
| $WO_3$ | 11.9 | 11.1 | 9.8 | 11.1 | 11.4 | 10.9 | 10.6 | 10.5 | 0.0 |
| Other component | — | — | — | — | — | — | — | — | — |
| Total | 100.0 | 100.0 | 100.0 | 100.0 | 100.0 | 100.0 | 100.0 | 100.0 | 100.0 |
| Content of alkali metal oxide (mol %) | 11.5 | 10.3 | 5.2 | 4.8 | 3.7 | 4.7 | 4.3 | 5.7 | 5.5 |
| $n_d$ | 2.00 | 2.02 | 2.01 | 2.00 | 1.99 | 1.96 | 1.95 | 2.05 | 1.97 |
| $T_g$ (° C.) | 483 | 483 | 476 | 483 | 479 | 474 | 468 | 463 | 480 |
| $\alpha_{50\text{-}300}$ ($10^{-7}$/K) | 81 | 76 | 77 | 73 | 72 | 72 | 75 | 84 | 73 |
| Evaluation | Good | Good | Good | Good | Good | Excellent | Excellent | Good | Good |

TABLE 2

| Example | 10 | 11 | 12 | 13 | 14 | 15 | 16 | 17 | 18 |
|---|---|---|---|---|---|---|---|---|---|
|  | Mol % | Mol % | Mol % | Mol % | Mol % | Mol % | Mol % | Mol % | Mol % |
| $P_2O_5$ | 27.7 | 25.8 | 24.3 | 21.9 | 20.0 | 21.1 | 19.3 | 25.0 | 19.3 |
| $Bi_2O_3$ | 16.4 | 16.8 | 15.3 | 14.3 | 23.0 | 15.1 | 22.3 | 6.4 | 22.0 |
| $Nb_2O_5$ | 17.4 | 17.9 | 16.2 | 15.2 | 11.2 | 16.0 | 10.8 | 17.3 | 15.2 |
| ZnO | 22.7 | 23.3 | 26.7 | 19.9 | 25.1 | 21.0 | 24.3 | 22.6 | 10.7 |
| $B_2O_3$ | 0.0 | 0.0 | 2.8 | 14.9 | 11.7 | 10.9 | 11.3 | 13.0 | 10.0 |
| $Li_2O$ | 5.5 | 5.7 | 5.1 | 4.8 | 0.0 | 0.0 | 0.0 | 5.5 | 4.3 |
| $Na_2O$ | 0.0 | 0.0 | 0.0 | 0.0 | 0.0 | 6.4 | 0.0 | 0.0 | 0.0 |
| $K_2O$ | 0.0 | 0.0 | 0.0 | 0.0 | 0.0 | 0.0 | 3.3 | 0.0 | 0.0 |
| $TiO_2$ | 0.0 | 0.0 | 0.0 | 0.0 | 0.0 | 0.0 | 0.0 | 0.0 | 10.6 |
| $WO_3$ | 10.3 | 10.5 | 9.4 | 9.0 | 9.0 | 9.5 | 8.7 | 10.2 | 7.9 |
| Other component | — | — | $Sb_2O_3$ 0.2 | — | — | — | — | — | — |
| Total | 100.0 | 100.0 | 100.0 | 100.0 | 100.0 | 100.0 | 100.0 | 100.0 | 100.0 |
|  | Mass % | Mass % | Mass % | Mass % | Mass % | Mass % | Mass % | Mass % | Mass % |
| $P_2O_5$ | 19.1 | 17.7 | 17.5 | 16.6 | 13.2 | 15.5 | 13.0 | 21.6 | 12.8 |
| $Bi_2O_3$ | 37.1 | 37.7 | 36.3 | 35.6 | 49.9 | 36.4 | 49.2 | 18.2 | 47.9 |
| $Nb_2O_5$ | 22.4 | 23.0 | 21.9 | 21.6 | 13.9 | 22.0 | 13.6 | 28.1 | 18.9 |
| ZnO | 9.0 | 9.1 | 11.1 | 8.7 | 9.5 | 8.8 | 9.4 | 11.2 | 4.1 |
| $B_2O_3$ | 0.0 | 0.0 | 1.0 | 5.5 | 3.8 | 3.9 | 3.7 | 5.5 | 3.2 |
| $Li_2O$ | 0.8 | 0.8 | 0.8 | 0.8 | 0.0 | 0.0 | 0.0 | 1.0 | 0.6 |
| $Na_2O$ | 0.0 | 0.0 | 0.0 | 0.0 | 0.0 | 2.0 | 0.0 | 0.0 | 0.0 |
| $K_2O$ | 0.0 | 0.0 | 0.0 | 0.0 | 0.0 | 0.0 | 1.5 | 0.0 | 0.0 |
| $TiO_2$ | 0.0 | 0.0 | 0.0 | 0.0 | 0.0 | 0.0 | 0.0 | 0.0 | 3.9 |
| $WO_3$ | 11.6 | 11.7 | 11.1 | 11.2 | 9.7 | 11.4 | 9.6 | 14.4 | 8.6 |
| Other component | — | — | $Sb_2O_3$ 0.3 | — | — | — | — | — | — |
| Total | 100.0 | 100.0 | 100.0 | 100.0 | 100.0 | 100.0 | 100.0 | 100.0 | 100.0 |
| Content of alkali metal oxide (mol %) | 6.4 | 5.7 | 5.1 | 4.8 | 0 | 6.4 | 3.3 | 5.5 | 4.3 |

TABLE 2-continued

| Example | 10 | 11 | 12 | 13 | 14 | 15 | 16 | 17 | 18 |
|---|---|---|---|---|---|---|---|---|---|
| $n_d$ | 1.99 | 2.01 | 1.99 | 1.96 | 2.00 | 1.97 | 1.99 | 1.89 | 2.08 |
| $T_g$ (° C.) | 485 | 486 | 475 | 485 | 487 | 482 | 480 | 490 | 488 |
| $\alpha_{50-300}$ ($10^{-7}$/K) | 80 | 79 | 70 | 69 | 80 | 78 | 85 | 61 | 75 |
| Evaluation | Good | Good | Excellent | Good | Good | Good | Good | Good | Good |

TABLE 3

| Example | 19 | 20 | 21 | 22 | 23 | 24 | 25 | 26 | 27 |
|---|---|---|---|---|---|---|---|---|---|
| | Mol % | Mol % | Mol % | Mol % | Mol % | Mol % | Mol % | Mol % | Mol % |
| $P_2O_5$ | 21.7 | 22.5 | 20.4 | 20.1 | 21.7 | 21.0 | 21.0 | 21.0 | 21.0 |
| $Bi_2O_3$ | 22.2 | 14.7 | 13.3 | 14.5 | 14.2 | 13.7 | 13.7 | 13.7 | 13.7 |
| $Nb_2O_5$ | 6.4 | 25.4 | 14.2 | 15.3 | 15.0 | 14.5 | 14.5 | 14.5 | 14.5 |
| ZnO | 27.2 | 11.5 | 18.5 | 9.6 | 19.6 | 19.0 | 19.0 | 19.0 | 19.0 |
| $B_2O_3$ | 12.7 | 11.7 | 10.6 | 10.4 | 11.3 | 10.9 | 10.9 | 10.9 | 10.9 |
| $Li_2O$ | 0.0 | 5.0 | 4.5 | 8.3 | 4.8 | 4.6 | 4.6 | 4.6 | 4.6 |
| $Na_2O$ | 0.0 | 0.0 | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 | 0.0 | 0.0 |
| $TiO_2$ | 0.0 | 0.0 | 0.0 | 7.6 | 0.0 | 0.0 | 0.0 | 0.0 | 0.0 |
| $WO_3$ | 9.8 | 9.2 | 18.5 | 9.0 | 8.9 | 8.6 | 8.6 | 8.6 | 8.6 |
| Other component | — | — | — | $TeO_2$ 5.2 | $GeO_2$ 4.5 | MgO 7.7 | CaO 7.7 | SrO 7.7 | BaO 7.7 |
| Total | 100.0 | 100.0 | 100.0 | 100.0 | 100.0 | 100.0 | 100.0 | 100.0 | 100.0 |
| | Mass % | Mass % | Mass % | Mass % | Mass % | Mass % | Mass % | Mass % | Mass % |
| $P_2O_5$ | 15.0 | 15.3 | 14.8 | 15.1 | 16.4 | 16.7 | 16.7 | 16.4 | 16.3 |
| $Bi_2O_3$ | 50.5 | 32.9 | 31.7 | 35.6 | 35.3 | 35.8 | 35.7 | 35.2 | 34.8 |
| $Nb_2O_5$ | 8.3 | 32.4 | 19.3 | 21.5 | 21.3 | 21.6 | 21.5 | 21.3 | 21.0 |
| ZnO | 10.8 | 4.5 | 7.7 | 4.1 | 8.5 | 8.7 | 8.6 | 8.5 | 8.4 |
| $B_2O_3$ | 4.3 | 3.9 | 3.8 | 3.8 | 4.2 | 4.2 | 4.2 | 4.2 | 4.1 |
| $Li_2O$ | 0.0 | 0.7 | 0.7 | 1.3 | 0.8 | 0.8 | 0.8 | 0.8 | 0.7 |
| $Na_2O$ | 0.0 | 0.0 | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 | 0.0 | 0.0 |
| $TiO_2$ | 0.0 | 0.0 | 0.0 | 3.2 | 0.0 | 0.0 | 0.0 | 0.0 | 0.0 |
| $WO_3$ | 11.1 | 10.3 | 22.0 | 11.0 | 11.0 | 11.2 | 11.1 | 11.0 | 10.9 |
| Other component | — | — | — | $TeO_2$ 4.4 | $GeO_2$ 2.5 | MgO 1.0 | CaO 1.4 | SrO 2.6 | BaO 3.8 |
| Total | 100.0 | 100.0 | 100.0 | 100.0 | 100.0 | 100.0 | 100.0 | 100.0 | 100.0 |
| Content of alkali metal oxide (mol %) | 0 | 5 | 4.5 | 8.3 | 4.8 | 4.6 | 4.6 | 4.6 | 4.6 |
| $n_d$ | 1.98 | 2.02 | 1.98 | 1.99 | 1.95 | 1.95 | 1.95 | 1.95 | 1.95 |
| $T_g$ (° C.) | 483 | 490 | 478 | 470 | 477 | 483 | 482 | 483 | 484 |
| $\alpha_{50-300}$ ($10^{-7}$/K) | 82 | 68 | 72 | 85 | 73 | 77 | 81 | 81 | 84 |
| Evaluation | Good | Good | Good | Good | Good | Good | Good | Good | Good |

Examples 28 to 31

The flake-like glass having each composition shown in Examples 1, 2, 4 and 5 was weighed, mixed and melted in the manners as in Examples 1 to 27, and its melt was poured in a space of a twin-roll and then rapidly cooled to prepare a flake. Each flake was dry ground with an alumina-made ball mill for 1 hour to obtain each glass frit. The mass mean size of each frit glass was about 3 μm. 75 g of each glass frit obtained was kneaded with 25 g of an organic vehicle (obtained by dissolving 10 mass % of ethyl cellulose in α-terpineol) to prepare a glass paste. The glass paste was uniformly printed in a size of 9 cm square on the center of a soda lime glass substrate having a size of 10 cm square and a thickness of 0.55 mm, having a silica film coated on the surface thereof such that the film thickness after firing becomes 30 μm, and then dried at 150° C. for 30 minutes. The temperature was once returned to room temperature, and increased to 450° C. over 30 minutes, followed by maintaining the temperature (450° C.) for 30 minutes. Thereafter, the temperature was increased to 550° C. over 12 minutes, followed by maintaining the temperature (550° C.) for 30 minutes. Thereafter, the temperature was decreased to room temperature over 3 hours. Thus, a glass frit fired layer was formed on the soda lime glass substrate. Each substrate thus obtained was observed as to whether breakage occurs in the fired layer and the substrate. Furthermore, an average value of warpage of the substrate at four corners of the fired layer was measured, and it was judged as to whether or not the warpage can be allowable. When the average value of warpage exceeds 1.00 mm, it was judged that the warpage is not allowable. The results are shown in Table 4. The average thermal expansion coefficient ($\alpha_{50-300}$) at temperatures from 50° C. to 300° C. of the soda lime glass used is $83 \times 10^{-7}$/K.

TABLE 4

| Example | 28 | 29 | 30 | 31 |
|---|---|---|---|---|
| Composition of glass frit | Same as Example 1 | Same as Example 2 | Same as Example 4 | Same as Example 5 |
| Breakage of fired layer | None | None | None | None |
| Breakage of substrate | None | None | None | None |
| Average value of warpage of substrate at four corners of fired layer | 0.72 mm (Allowable) | 0.55 mm (Allowable) | 0.00 mm (Allowable) | 0.00 mm (Allowable) |

Comparative Examples 1 to 10

Composition of the glass in terms of mol %, refractive index ($n_d$), glass transition temperature ($T_g$), and average thermal expansion coefficient ($\alpha_{50-300}$) at temperatures from 50° C. to 300° C., in each Comparative Example are shown in Table 5. Composition in terms mass % calculated based on the composition in terms of mol % is also shown in Table 6. In each glass, when the glass transition temperature is not 490° C. or lower and the average thermal expansion coefficient is not from $60 \times 10^{-7}$/K to $85 \times 10^{-7}$/K, the glass was evaluated as "Poor". Each physical value of the glasses prepared in the same manners as in Examples 1 to 27 was measured in the same manner as in Examples 1 to 27. The refractive index ($n_d$) of Comparative Example 9 could not be measured due to large coloration. Comparative Examples 1 and 2 correspond to Examples 5 and 12 of the above-described Patent Document 3 (JP-A-2006-111499), respectively, Comparative Example 3 corresponds to Example 3 of the above-described Patent Document 1 (JP-A-2003-300751), Comparative Examples 4 and 5 correspond to Examples 1 and 2 of the above-described Patent Document 2 (JP-A-2003-160355), respectively, Comparative Examples 6, 7 and 8 correspond to Examples 1, 10 and 13 of the above-described Patent Document 5 (JP-A-2007-51060), respectively, and Comparative Example 9 corresponds to Example 3 of the above-described Patent Document 4 (JP-A-2002-201039).

TABLE 5

| | Comparative Example | | | | | | | | | |
|---|---|---|---|---|---|---|---|---|---|---|
| | 1 Mol % | 2 Mol % | 3 Mol % | 4 Mol % | 5 Mol % | 6 Mol % | 7 Mol % | 8 Mol % | 9 Mol % | 10 Mol % |
| $P_2O_5$ | 25.0 | 25.5 | 18.6 | 23.0 | 25.4 | 25.29 | 25.41 | 26.26 | 0.0 | 23.1 |
| $Bi_2O_3$ | 8.0 | 20.0 | 5.5 | 6.7 | 6.6 | 5.39 | 4.71 | 4.74 | 42.7 | 16.6 |
| $Nb_2O_5$ | 18.0 | 18.0 | 24.6 | 15.3 | 18.3 | 25.66 | 23.35 | 27.73 | 0.0 | 17.6 |
| ZnO | 1.0 | 0.0 | 0.0 | 0.0 | 0.0 | 0.00 | 0.00 | 0.00 | 28.5 | 0.0 |
| $B_2O_3$ | 2.0 | 2.0 | 9.8 | 0.0 | 0.0 | 0.00 | 0.00 | 0.00 | 28.7 | 5.5 |
| $Li_2O$ | 18.0 | 6.0 | 7.6 | 10.5 | 8.1 | 18.02 | 16.43 | 18.43 | 0.0 | 11.6 |
| $Na_2O$ | 10.0 | 10.5 | 21.9 | 17.7 | 18.3 | 0.00 | 0.00 | 0.00 | 0.0 | 4.0 |
| $K_2O$ | 2.0 | 2.0 | 0.0 | 0.0 | 2.9 | 1.91 | 1.91 | 1.96 | 0.0 | 2.5 |
| $Cs_2O$ | 0.0 | 0.0 | 0.0 | 0.0 | 0.0 | 0.00 | 0.00 | 1.95 | 0.0 | 0.0 |
| $Ti_2O$ | 7.0 | 7.0 | 10.4 | 13.8 | 11.3 | 0.00 | 0.71 | 0.00 | 0.0 | 8.7 |
| $WO_3$ | 8.0 | 8.0 | 0.0 | 9.4 | 9.1 | 10.84 | 10.82 | 9.37 | 0.0 | 10.4 |
| BaO | 1.0 | 1.0 | 1.5 | 3.6 | 0.0 | 2.34 | 4.62 | 0.00 | 0.0 | 0.0 |
| $Sb_2O_3$ | 0.0 | 0.1 | 0.1 | 0.1 | 0.1 | 0.25 | 0.06 | 0.06 | 0.0 | 0.0 |
| $GeO_2$ | 0.0 | 0.0 | 0.0 | 0.0 | 0.0 | 10.30 | 10.03 | 8.63 | 0.0 | 0.0 |
| Other component | — | — | — | — | — | — | $MoO_3$ 0.01 | — | $CeO_2$ 0.1 | — |
| Total | 100.0 | 100.1 | 100.0 | 100.1 | 100.1 | 100.0 | 100.0 | 100.0 | 100.0 | 100.0 |
| Content of alkali metal oxides (mol %) | 30.0 | 18.5 | 29.5 | 28.2 | 29.3 | 19.9 | 18.3 | 20.4 | 0.0 | 18.1 |
| $n_d$ | 1.91 | 2.00 | 1.90 | 1.92 | 1.90 | 1.94 | 1.91 | 1.92 | — | 2.01 |
| Tg (° C.) | 465 | 485 | 495 | 479 | 493 | 525 | 520 | 536 | 370 | 479 |
| $\alpha_{50-300}$ ($10^{-7}$/K) | 104 | 103 | 108 | 115 | 115 | 72 | 77 | 73 | 102 | 92 |
| Evaluation | Poor | Poor | Poor | Poor | Poor | Poor | Poor | Poor | Poor | Poor |

TABLE 6

| | Comparative Example | | | | | | | | | |
|---|---|---|---|---|---|---|---|---|---|---|
| | 1 Mass % | 2 Mass % | 3 Mass % | 4 Mass % | 5 Mass % | 6 Mass % | 7 Mass % | 8 Mass % | 9 Mass % | 10 Mass % |
| $P_2O_5$ | 21.9 | 17.0 | 17.5 | 20.8 | 22.3 | 20.33 | 20.42 | 20.64 | 0.0 | 16.4 |
| $Bi_2O_3$ | 23.0 | 43.5 | 17.0 | 19.8 | 18.9 | 14.23 | 12.44 | 12.23 | 82.1 | 38.6 |
| $Nb_2O_5$ | 29.5 | 22.3 | 43.4 | 26.0 | 30.0 | 38.62 | 35.14 | 40.82 | 0.0 | 23.4 |
| ZnO | 0.5 | 0.0 | 0.0 | 0.0 | 0.0 | 0.00 | 0.00 | 0.00 | 9.6 | 0.0 |
| $B_2O_3$ | 0.9 | 0.6 | 4.5 | 0.0 | 0.0 | 0.00 | 0.00 | 0.00 | 8.2 | 1.9 |
| $Li_2O$ | 3.3 | 0.8 | 1.5 | 2.0 | 1.5 | 3.05 | 2.78 | 3.05 | 0.0 | 1.7 |
| $Na_2O$ | 3.8 | 3.0 | 9.0 | 7.0 | 7.0 | 0.00 | 0.00 | 0.00 | 0.0 | 1.2 |
| $K_2O$ | 1.2 | 0.9 | 0.0 | 0.0 | 1.7 | 1.02 | 1.02 | 1.02 | 0.0 | 1.2 |
| $Cs_2O$ | 0.0 | 0.0 | 0.0 | 0.0 | 0.0 | 0.00 | 3.62 | 5.13 | 0.0 | 0.0 |
| $Ti_2O$ | 3.5 | 2.6 | 5.5 | 7.0 | 5.6 | 0.00 | 0.32 | 0.00 | 0.0 | 3.5 |
| $WO_3$ | 11.5 | 8.6 | 0.0 | 13.9 | 13.0 | 14.23 | 14.20 | 12.03 | 0.0 | 12.1 |

TABLE 6-continued

|  | Comparative Example | | | | | | | | | |
|---|---|---|---|---|---|---|---|---|---|---|
|  | 1 Mass % | 2 Mass % | 3 Mass % | 4 Mass % | 5 Mass % | 6 Mass % | 7 Mass % | 8 Mass % | 9 Mass % | 10 Mass % |
| BaO | 0.9 | 0.7 | 1.5 | 3.5 | 0.0 | 2.03 | 4.01 | 0.00 | 0.0 | 0.0 |
| $Sb_2O_3$ | 0.0 | 0.2 | 0.1 | 0.2 | 0.2 | 0.41 | 0.10 | 0.10 | 0.0 | 0.0 |
| $GeO_2$ | 0.0 | 0.0 | 0.0 | 0.0 | 0.0 | 6.10 | 5.94 | 5.00 | 0.0 | 0.0 |
| Other component | — | — | — | — | — | — | $MoO_3$ 0.01 | — | $CeO_2$ 0.1 | — |
| Total | 100.0 | 100.2 | 100.0 | 100.2 | 100.2 | 100.0 | 100.0 | 100.0 | 100.0 | 100.0 |

Comparative Examples 11 and 12

Glass fits having each composition shown in Comparative Examples 1 and 10 were prepared in the same manner as in Examples 28 to 31, and fired on the same soda lime substrates in the same manner. Each substrate thus obtained was observed as to whether breakage occurs in the fired layer and the substrate. Furthermore, an average value of warpage of the substrate at four corners of the fired layer was measured, and it was judged as to whether or not the warpage can be allowable. When the average value of warpage exceeds 1.00 mm, it was judged that the warpage is not allowable. The results are shown in Table 7. The average thermal expansion coefficient ($\alpha_{50-300}$) at temperatures from 50° C. to 300° C. of the soda lime glass used is $83 \times 10^{-7}$/K.

TABLE 7

| Comparative Example | 11 | 12 |
|---|---|---|
| Composition of glass frit | Same as Comparative Example 1 | Same as Comparative Example 10 |
| Breakage of fired layer | Present | None |
| Breakage of substrate | Present | None |
| Average value of warpage of substrate at four corners of fired layer | Measurement impossible due to breakage (Not allowable) | 1.33 mm (Not allowable) |

This application is based on Japanese Patent Application No. 2009-014331 filed on Jan. 26, 2009, the disclosures of which are incorporated herein by reference.

The present invention makes it possible to produce a high efficient scattering light extraction member for particularly organic LED uses by applying a glass composition having high refractive index, softening property at low temperature and small average thermal expansion coefficient to an optical member. Especially, according to the present invention, a glass frit suitable for a scattering layer which enables an organic LED light extraction to improve can be provided. Furthermore, the glass frit of the present invention does not give deformation and unallowable warpage to the substrate after firing and softening on the soda line substrate, and does not cause breakage. For this reason, the glass frit of the present invention can use a soda lime substrate as a substrate of an organic LED scattering layer, and can reduce the production cost.

100: Glass or ceramic substrate
101: Glass layer or fired layer of glass frit
102: Scattering material
103: Translucent electrode layer

The invention claimed is:

1. A glass composition having a refractive index ($n_d$) of from 1.88 to 2.20, a glass transition temperature ($T_g$) of from 450 to 490° C. and an average thermal expansion coefficient at temperatures from 50° C. to 300° C. ($\alpha_{50-300}$) of from $60 \times 10^{-7}$/K to $85 \times 10^{-7}$/K, and comprising $Bi_2O_3$ in an amount of from 5 to 25% in terms of mol % on the basis of oxides.

2. The glass composition according to claim 1, comprising, in terms of mol % on the basis of oxides:
 15 to 30% of $P_2O_5$,
 5 to 27% of $Nb_2O_5$, and
 4 to 35% of ZnO.

3. The glass composition according to claim 2, comprising, in terms of mol % on the basis of oxides:
 0 to 17% of $B_2O_3$,
 0 to 14% of $Li_2O$,
 0 to 7% of $Na_2O$,
 0 to 7% of $K_2O$,
 0 to 13% of $TiO_2$,
 0 to 20% of $WO_3$,
 0 to 7% of $TeO_2$,
 0 to 7% of $GeO_2$,
 0 to 2% of $Sb_2O_3$, and
 0 to 10% of alkaline earth metal oxides,
wherein a total content of alkali metal oxides is 14% or less.

4. The glass composition according to claim 2, which does not substantially contain $Na_2O$ and $K_2O$.

5. The glass composition according to claim 2, wherein the total content of the alkali metal oxides is 2 to 7 mol %.

6. The glass composition according to claim 3, wherein a content of ZnO exceeds 23 mol % and exceeds 10 mass %, and $TiO_2$ is not substantially contained.

7. The glass composition according to claim 1, which does not substantially contain lead oxide.

8. A glass frit having the composition according to claim 1.

9. A member provided with a glass layer having the composition according to claim 1 on a glass or ceramic substrate.

10. A member provided with a glass layer obtained by firing the glass frit according to claim 8 on a glass or ceramic substrate.

* * * * *